(12) United States Patent
Summerfelt et al.

(10) Patent No.: US 7,220,600 B2
(45) Date of Patent: May 22, 2007

(54) FERROELECTRIC CAPACITOR STACK ETCH CLEANING METHODS

(75) Inventors: Scott R. Summerfelt, Dallas, TX (US); Lindsey H. Hall, Plano, TX (US); Kezhakkedath R. Udayakumar, Dallas, TX (US); Theodore S. Moise, IV, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/016,400

(22) Filed: Dec. 17, 2004

(65) Prior Publication Data

US 2006/0134808 A1 Jun. 22, 2006

(51) Int. Cl.
*H01G 7/06* (2006.01)
*H01L 32/00* (2006.01)

(52) U.S. Cl. .......................... 438/3; 438/689; 438/240
(58) Field of Classification Search ................ 438/689, 438/243, 3
See application file for complete search history.

(56) References Cited

U.S. PATENT DOCUMENTS

| | | | | |
|---|---|---|---|---|
| 5,618,747 | A * | 4/1997 | Lou ........................... | 438/398 |
| 6,211,035 | B1 * | 4/2001 | Moise et al. ................ | 438/396 |
| 6,251,794 | B1 * | 6/2001 | Peng et al. .................. | 438/712 |
| 6,436,838 | B1 * | 8/2002 | Ying et al. .................. | 438/710 |
| 6,500,678 | B1 * | 12/2002 | Aggarwal et al. ............ | 438/3 |
| 6,533,948 | B2 * | 3/2003 | Kato et al. ................... | 216/6 |
| 6,548,343 | B1 | 4/2003 | Summerfelt et al. | |
| 6,596,547 | B2 * | 7/2003 | Aggarwal et al. ............ | 438/3 |
| 6,635,498 | B2 * | 10/2003 | Summerfelt et al. .......... | 438/3 |
| 6,680,516 | B1 * | 1/2004 | Blosse et al. ................ | 257/412 |
| 6,692,976 | B1 | 2/2004 | Mirkarimi et al. | |
| 6,713,342 | B2 * | 3/2004 | Celii et al. .................. | 438/239 |
| 6,734,477 | B2 | 5/2004 | Moise et al. | |
| 6,767,750 | B2 * | 7/2004 | Summerfelt et al. .......... | 438/3 |
| 6,828,161 | B2 * | 12/2004 | Summerfelt et al. .......... | 438/3 |
| 6,939,791 | B2 * | 9/2005 | Geffken et al. ............. | 438/622 |
| 6,943,126 | B1 * | 9/2005 | Narayanan et al. ......... | 438/784 |
| 6,962,853 | B2 * | 11/2005 | Segawa et al. ............. | 438/303 |
| 2003/0143800 | A1 | 7/2003 | Hall et al. | |

OTHER PUBLICATIONS

"Plasma-Assisted Dry Etching of Ferroelectric Capacitor Modules and Application to a 32M Ferroelectric Random Access Memory Devices with Submicron Feature Sizes", Sang-Woo Lee, Suk-Ho Joo, Sung Lae Cho, Yoon-Ho Son, Dyu-Mann Lee, Sang-Don Nam, Kun-Sang Park, Yong-Tak Lee, Jung-Suk Seo, Young-Dae Kim, Hyeong-Geun An, Hyoung-Boon Kim, Yong-Ju Jung, Jang-Eun Heo, Moon-Sook Lee, Soon-Oh Park U-In Chung and Joo-Tae Moon, Jpn. J Applied Physics, vol. 41, Part 1 No. 11B, Nov. 2002, pp. 6749-6753.

(Continued)

*Primary Examiner*—Andy Huynh
*Assistant Examiner*—David Goodwin
(74) *Attorney, Agent, or Firm*—Jacqueline J. Garner; W. James Brady, III; Frederick J. Telecky, Jr.

(57) ABSTRACT

Methods (100) are provided for fabricating a ferroelectric capacitor structure including methods (128) for etching and cleaning patterned ferroelectric capacitor structures in a semiconductor device. The methods comprise etching (140, 200) portions of an upper electrode, etching (141, 201) ferroelectric material, and etching (142, 202) a lower electrode to define a patterned ferroelectric capacitor structure, and etching (143, 206) a portion of a lower electrode diffusion barrier structure. The methods further comprise ashing (144, 203) the patterned ferroelectric capacitor structure using a first ashing process, performing (145, 204) a wet clean process after the first ashing process, and ashing (146, 205) the patterned ferroelectric capacitor structure using a second ashing process directly after the wet clean process at a high temperature in an oxidizing ambient.

20 Claims, 14 Drawing Sheets

OTHER PUBLICATIONS

"Highly Reliable and Mass-productive FRAM Embedded Smartcard using Advanced Integration Technologies", H.J. Joo, Y.J. Song, H.H. Kim, S.K. Kang, J.H. Park, Y.M. Kang, E.Y. Kang, S.Y. Lee, H.S. Deong and Kinam Kim, IEEE 2004 Symposium on VLSI Technology Digest of Technical Papers, 2 pgs.

"Robust 3-Metallization BEOL Process for 0.18 μm Embedded FRAM", S.K. Kang, H.S. Rhie, H.H. Kim, H.,J. Joo, J.H. Park, Y.M. Kang, D.Y. Choi, S.Y. Lee and Kinam Kim, 2004 International Conference on Solid State Devices and Materials (SSDM 2004), Sep. 15-17, 2004, 2 pgs.

Highly Manufacturable and Reliable 32Mb FRAM Technology with Novel BC and Capacitor Cleaning Process, Y.J. Song, H.J. Joo, N.W. Jang, H.H. Kim, J.H. Park, H.Y. Kang, S.Y. Lee and Kinam Kim, 2003 Symposium on VLSI Technology Diges of Technical papers, 2 pgs.

* cited by examiner

FERROELECTRIC CAPACITOR STACK ETCH CLEANING METHODS

FIELD OF INVENTION

The present invention relates generally to semiconductor devices and more particularly to methods for cleaning etched ferroelectric capacitor structures in the fabrication of semiconductor devices.

BACKGROUND OF THE INVENTION

Memory systems are used for storage of data, program code, and/or other information in many electronic products, such as personal computer systems, embedded processor-based systems, video image processing circuits, portable phones, and the like. Ferroelectric memory, sometimes referred to as "FRAM" or "FERAM", is a non-volatile form of memory commonly organized in single-transistor, single-capacitor (1T1C) or two-transistor, two-capacitor (2T2C) cell configurations, in which each memory cell includes one or more pairs of access transistors and cell capacitors formed using ferroelectric dielectric material. The non-volatility of an FERAM memory cell results from a bi-stable or multi-stable characteristic of the ferroelectric dielectric material in the cell capacitor(s), wherein the ferroelectric material has multiple electrically distinguishable stable states. Ferroelectric memory is often fabricated in stand-alone memory integrated circuits (ICs) and/or in other semiconductor products such as logic circuits having on-board non-volatile memory, microprocessors, DSPs, communications chips, etc. The ferroelectric memory cells are typically organized in an array architecture, such as folded-bitline, open-bitline, etc., wherein the individual cells are selected by plateline and wordline signals from address decoder circuitry, with the data being read from or written to the cells along bitlines using latch or sense amp circuits. In a typical 1T1C memory cell, a ferroelectric capacitor is coupled between a plateline signal and a source/drain of a MOS cell transistor, the other source/drain is connected to a bitline, and the transistor gate is connected to a wordline control signal to selectively couple the capacitor with the bitline during read and write operations.

The ferroelectric memory arrays are typically constructed in a device wafer along with CMOS logic circuits, wherein the cell transistors are formed concurrently with logic transistors in the device, and the ferroelectric capacitors are constructed in a capacitor layer above the wafer substrate. For example, the construction of the ferroelectric cell capacitors may be integrated into a CMOS fabrication process flow after transistor formation (e.g., after standard 'front-end' processing), and before the metalization or interconnection processing (e.g., before 'back-end' processing). In a typical integration of ferroelectric capacitors in a CMOS process flow, transistors are formed on/in a semiconductor body, and a pre-metal dielectric (PMD) layer is constructed over the transistors, including tungsten contacts extending through the PMD level dielectric to the gate and source/drain terminals of the transistors. Ferroelectric cell capacitors are then constructed in a first inter-level or inter-layer dielectric layer (e.g., ILD0) above the PMD level, where one of the cell capacitor electrodes (e.g., a lower or bottom electrode) is connected to a cell transistor terminal (e.g., typically a source/drain) through one of the tungsten PMD contacts, wherein interconnection of the other capacitor electrode (the top or upper electrode) and the remaining transistor terminals with other components (e.g., signal routing) is provided in one or more metalization layers or levels above the ILD0 level.

In constructing the ferroelectric cell capacitors in the initial ILD0 or other level, it is important to minimize leakage between the upper and lower capacitor electrodes, as well as the crystallinity and orientation of the ferroelectric material that is formed over the lower electrode. However, conventional ferroelectric cell fabrication techniques often lead to unacceptable levels of leakage and degraded polarization performance of ferroelectric cell capacitors, particularly for scaled smaller capacitor dimensions, whereby there is a need for improved methods for ferroelectric capacitor fabrication in the manufacture of semiconductor devices.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention. Etching processes used for patterning the ferroelectric cell capacitor stack structures can lead to damage of the ferroelectric material. The inventors have found that while conventional post-etch cleaning operations may help to mitigate ferroelectric material damage and capacitor leakage, these issues remain a problem in the fabrication of semiconductor devices employing ferroelectric capacitors, particularly capacitor leakage where the sizes thereof are scaled to smaller and smaller dimensions. The present invention relates to semiconductor fabrication techniques in which etched ferroelectric capacitor structures are cleaned prior to forming an overlying dielectric (ILD) material. Methods are provided for fabricating a ferroelectric capacitor structure, and for etching and cleaning patterned ferroelectric capacitor structures in a semiconductor device, by which capacitor leakage and other performance degradation may be mitigated.

In one aspect of the invention, a method is provided for fabricating a ferroelectric capacitor structure in a semiconductor device, comprising forming a lower electrode diffusion barrier structure over a dielectric material, as well as forming a lower electrode over the lower electrode diffusion barrier structure, a ferroelectric material over the lower electrode, and an upper electrode over the ferroelectric material. A patterned etch mask is then provided over the upper electrode, exposing a portion of the upper electrode. The method further comprises etching portions of the upper electrode, the ferroelectric material, and the lower electrode to define a patterned ferroelectric capacitor structure, and etching a portion of the lower electrode diffusion barrier structure, using the patterned etch mask. In addition, the method comprises ashing the patterned ferroelectric capacitor structure using a first ashing process, performing a wet clean process after the first ashing process, and ashing the patterned ferroelectric capacitor structure using a second ashing process directly after the wet clean process at a high temperature in an oxidizing ambient. In one example, the second ashing process is performed at a temperature of about 300 degrees C. or more for 2 to 3 minutes using an O2 gas flow after the wet cleaning. In one implementation, the first ashing process, the wet clean process, and the second ashing process are performed after etching the lower electrode diffusion barrier structure, and in an alternate implementation, the lower electrode diffusion barrier structure is etched prior to the first ashing process, the wet clean process, and the second ashing process.

Another aspect of the invention provides a method of etching and cleaning a ferroelectric capacitor structure in a semiconductor device, comprising etching portions of an upper electrode, a ferroelectric material, and a lower electrode to define a patterned ferroelectric capacitor structure, etching a portion of a lower electrode diffusion barrier structure, ashing the patterned ferroelectric capacitor structure using a first ashing process, performing a wet clean process after the first ashing process, and ashing the patterned ferroelectric capacitor structure using a second ashing process after the wet clean process at a high temperature, such as about 300 degrees C. or more, in an oxidizing ambient with no material formation processing between the wet clean process and the second ashing process.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
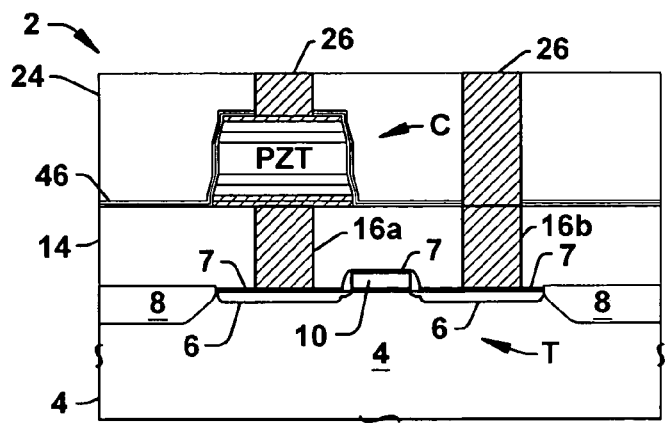
FIG. 1A is a partial side elevation view in section illustrating an exemplary ferroelectric memory cell in a portion of a semiconductor device wafer in accordance with one or more aspects of the invention having a ferroelectric cell capacitor with a lower electrode coupled with a MOS cell transistor source/drain to form a 1T1C ferroelectric memory cell.

The present invention will now be described with reference to the attached drawing figures, wherein like reference numerals are used to refer to like elements throughout. The invention relates to the use of high temperature ashing processes and wet cleaning of etched ferroelectric capacitor stack structures, by which capacitor leakage may be mitigated in the fabrication of semiconductor devices. The invention may be carried out in any type of semiconductor device, for example, devices having memory cells with ferroelectric cell capacitors or other devices, such as integrated circuits, in which ferroelectric capacitors are used. The various aspects and advantages of the invention are hereinafter illustrated and described in conjunction with the drawings, wherein the illustrated structures are not necessarily drawn to scale.

Figure 1B:
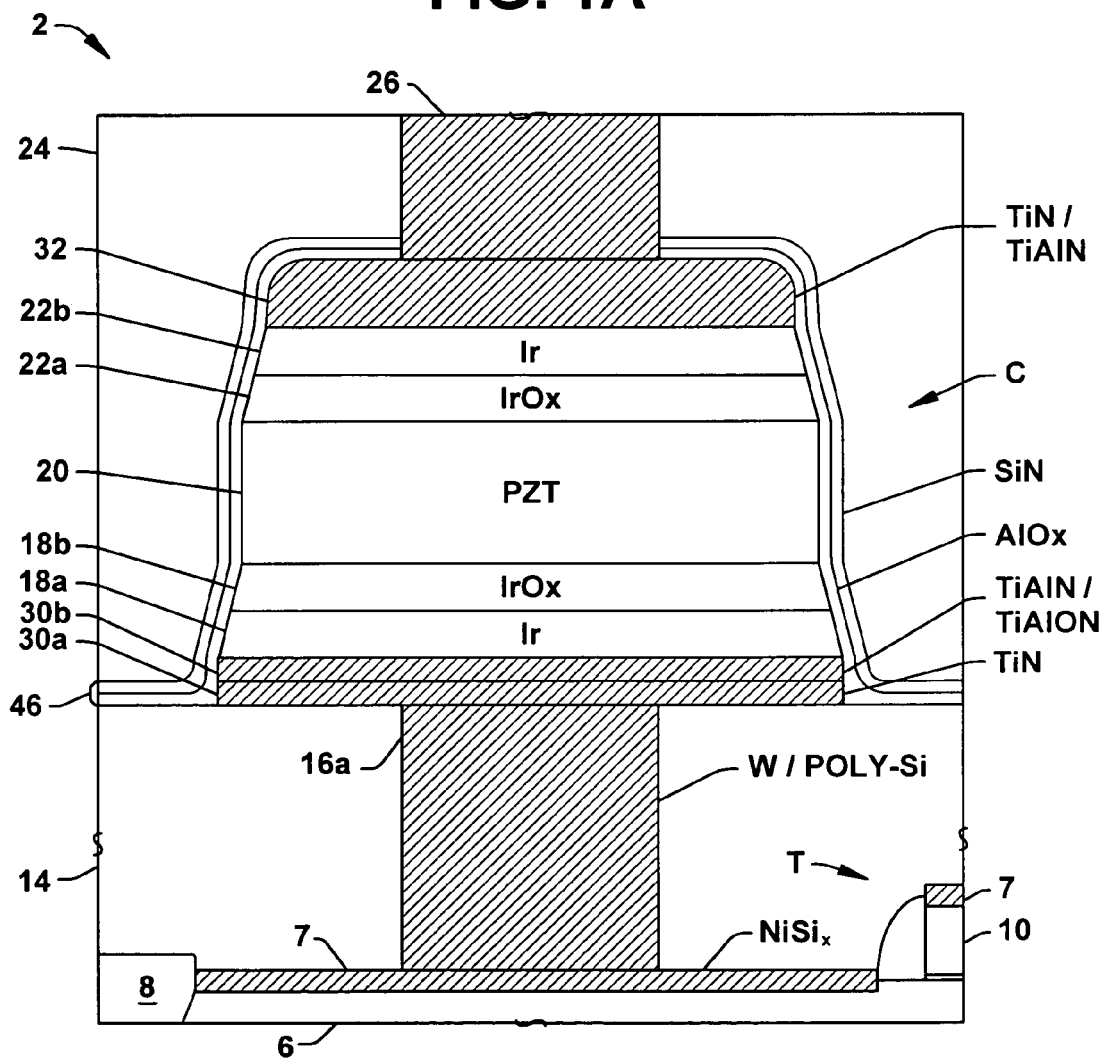
FIG. 1B is a partial side elevation view in section further illustrating the ferroelectric cell capacitor structure in the memory cell of FIG. 1A.

FIGS. 1A and 1B illustrate an exemplary ferroelectric memory cell (1T1C) with a cell transistor T and a ferroelectric capacitor C in a semiconductor device 2 formed in a wafer comprising a silicon substrate 4 in accordance with various aspects of the invention. Although the exemplary device 2 employgs 1T1C cell structures that may be configured in a folded bitline array, the various aspects of the invention are not limited to any particular cell type or array architecture, and may alternatively be employed with 2T2C cells or other cell types, wherein all such alternative implementations are contemplated as falling within the scope of the present invention and the appended claims. As illustrated in FIG. 1A, the cell transistor T includes a gate structure 10 having a gate dielectric between a conductive gate electrode and a channel region of the substrate 4, with source/drains 6 formed on either side of the channel in an active region located between STI isolation structures 8, and conductive silicide structures 7 formed on the transistor source/drains 6 and the gate 10.

A pre-metal dielectric (PMD) 14 is provided above the substrate 4 to cover the cell transistor T, where any suitable dielectric material and thickness may be used for the PMD layer 14. A conductive storage node contact 16a and a conductive bitline contact 16b are formed through the PMD layer 14 using any suitable materials and dimensions (e.g., tungsten (W), polysilicon, or other conductive material) to connect with the silicide structures 7 of the cell transistor source/drains 6, wherein the conductive polysilicon electrode of the gate 10 forms a memory array wordline connection in the illustrated device 2. The vertical ferroelectric capacitor C is formed above the cell storage node source/drain contact 16a (e.g., above the PMD level), and comprises a bilayer lower electrode diffusion barrier structure 30a, 30b, and a bilayer lower or bottom electrode 18a, 18b with an overlying ferroelectric material 20 (PZT in this example), and a bilayer upper or top electrode 22 above the PZT 20. A multilayer sidewall or upper diffusion barrier 46 is formed over the patterned ferroelectric capacitor C, including an aluminum oxide material $AlO_x$ and a silicon nitride material SiN. A first inter-level or inter-layer dielectric layer (ILD0) 24 is formed over the barrier 46, and conductive contacts 26 are formed through the dielectric 24 (and through the barrier 46) to couple with the upper capacitor electrode 22 (plateline) and with the bitline contact 16 in the PMD level 14, wherein the device 2 may include further overlying metalization layers or levels (not shown).

FIG. 1B illustrates further details of the exemplary ferroelectric capacitor C, which comprises a PZT ferroelectric material 20 sandwiched in a vertical capacitor stack structure between a multilayer upper (top) electrode 22a, 22b (collectively referred to as 22) and a multilayer lower (bottom) electrode 18a, 18b (18 collectively), where a remnant portion of a capacitor stack etch hardmask 32 is situated between the upper electrode 22 and an ILD0 plateline contact 26. At least a portion of the lower electrode diffusion barrier 30a, 30b (30 collectively) is formed over the storage node contact 16a in the PMD dielectric 14. Any suitable single or multilayer upper and lower electrodes or diffusion barriers may be employed within the scope of the invention. The conductive diffusion barrier 30 is formed on the storage node contact 16a prior to deposition of the lower electrode layers 18a and 18b, for protecting the PMD contact 16a during subsequent processing of the capacitor dielectric 20. The conductive barrier 30 can be any suitable conductive material or materials that prevent or inhibit degradation of the contact 16a, such as TiAlN or other possible barriers (some of which have a slow oxidation rate compared to TiN) which include: TaSiN, TiSiN, TiN, TaN, HfN, ZrN, HfAlN, CrN, TaAlN, CrAlN, or any other conductive material, or stacks or combinations thereof, where the barrier 30a, 30b (30 collectively) is preferably thin, such as having a thickness of about 100 nm or less in one example. The exemplary lower electrode barrier 30 in the device 2 comprises a TiN first barrier layer 30a of any suitable thickness (e.g., about 40 nm in one example), and a TiAlN second barrier layer 30b of any suitable thickness, such as about 30 nm in the illustrated implementation. Alternatively, the second barrier layer 30b could be TIAlON, or a single barrier layer 30 could be formed over all or a portion of the contact 16a, such as TiAlN having a thickness of about 60 nm in one possible implementation.

The lower electrode layers 18 are formed on the barrier 30 so as to make electrical connection with the underlying contact 16a. In one example, the lower electrode 18 has a total thickness of about 25-100 nm, is stable in oxygen, and comprises a noble metal or conductive oxide such as Ir, $IrO_x$, Pt, Pd, $PdO_x$, Au, Ru, $RuO_x$, Rh, $RhO_x$, $LaSrCoO_3$, $(Ba,Sr)RuO_3$, $LaNiO_3$ or stacks or combinations thereof, although other materials may be used. In cases where PZT material is used for the ferroelectric 20, suitable exemplary bottom electrodes 18 include either 50 nm Ir or a stack comprised of 30 nm $IrO_x$ and 20 nm Ir. In the exemplary device 2, a lower Iridium (Ir) layer 18a is formed on the barrier 30b to any suitable thickness, such as about 20 nm in the illustrated example. A lower Iridium Oxide ($IrO_x$) layer 18b is then formed over the lower Ir layer 18a to any suitable thickness, such as about 30 nm in the illustrated implementation. The $IrO_x$ layer 18b may advantageously operate to improve switching endurance fatigue properties by curing oxygen vacancies in the overlying PZT material 20, wherein it is desirable to avoid or mitigate reduction of (e.g., loss of oxygen content from) the IrO) layer 18b during formation of the PZT 20.

The exemplary ferroelectric material 20 is PZT having any suitable thickness, such as about 300 to 1000 Å, preferably about 700 Å in one example, where the PZT may be formed by any suitable deposition method or other material formation techniques, such as metal organic chemical vapor deposition (MOCVD) in the device 2, preferably in a manner that avoids or inhibits reduction of the $IrO_x$ material 18b. Optional post-deposition rapid thermal annealing (RTA) may be employed to provide desired material properties of the PZT capacitor dielectric 20. Any suitable ferroelectric material 20 may be used, wherein the present invention is not limited to PZT.

The upper electrode 22 includes an upper $IrO_x$ layer 22a formed over the PZT 20 to any suitable thickness, such as about 100 nm or less, as well as an upper Ir layer 22b formed over the upper $IrO_x$ layer 22a to any suitable thickness, such as about 100 nm or less. A hardmask 32 is formed above the upper Ir layer 22b, for use in etching the patterned ferroelectric capacitor stack structure C, where the hardmask 32 can be any suitable material such as TiN, TiAlN, etc. In combination with the PZT ferroelectric material 20, other materials may be substituted for the upper $IrO_x$ layer 22a, wherein it is advantageous to have a conductive oxide top electrode such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ rather than a single pure noble metal, so as to minimize degradation due to many opposite state write/read operations (fatigue). Moreover, it is advantageous to have the upper Ir layer 22b or another suitable noble metal layer above the upper oxide layer 22a to provide low resistance for connection of the upper electrode structure to the subsequently formed plateline contact 26 and the hardmask 32, although not a strict requirement of the invention.

The conductive hardmask 32 is deposited over the upper electrode 22, and is then patterned using any suitable lithographic techniques. Thereafter, the patterned hard mask 32 is used in selectively etching the upper and lower electrodes and the PZT 20 to define a patterned vertical ferroelectric capacitor structure C as shown in FIG. 1B. In addition, the single mask 32 is used in the exemplary device 2 for etching the exposed lower electrode diffusion barrier bilayer structure 30a, 30b, wherein the use of a single stack etch mask 32 facilitates scaling the dimensions of the ferroelectric capacitor C in the device 2. The hardmask 32 may be any suitable single or multilayer material and need not remain over the upper electrode following capacitor stack structure patterning. In the exemplary device 2, a single layer TiN or TiAlN 32 is formed over the upper Ir layer 22b, and is patterned and used as an etch mask while etching the ferroelectric capacitor structure C.

The device 2 further includes a single or multilayer upper or sidewall diffusion barrier 46 formed over the patterned capacitor stack structure C, which operates to inhibit hydrogen diffusion into the PZT material 20 during subsequent fabrication processing. In the exemplary device 2, the hydrogen barrier 46 includes an aluminum oxide ($AlO_x$) first layer formed over the patterned capacitor C, and a silicon nitride (SiN) second upper diffusion barrier layer formed over the $AlO_x$. The ILD0 material 24 is then formed over the upper barrier 46, and conductive contacts 26 are formed through the ILD0 24 for connection to the upper electrode of the capacitor C (e.g., plateline connection), where the plateline contact 26 may be coupled to the Ir layer 22b through a portion of the remaining hardmask 32, as shown in FIG. 1B, or may be directly connected to the upper Ir 22b.

Figure 2:
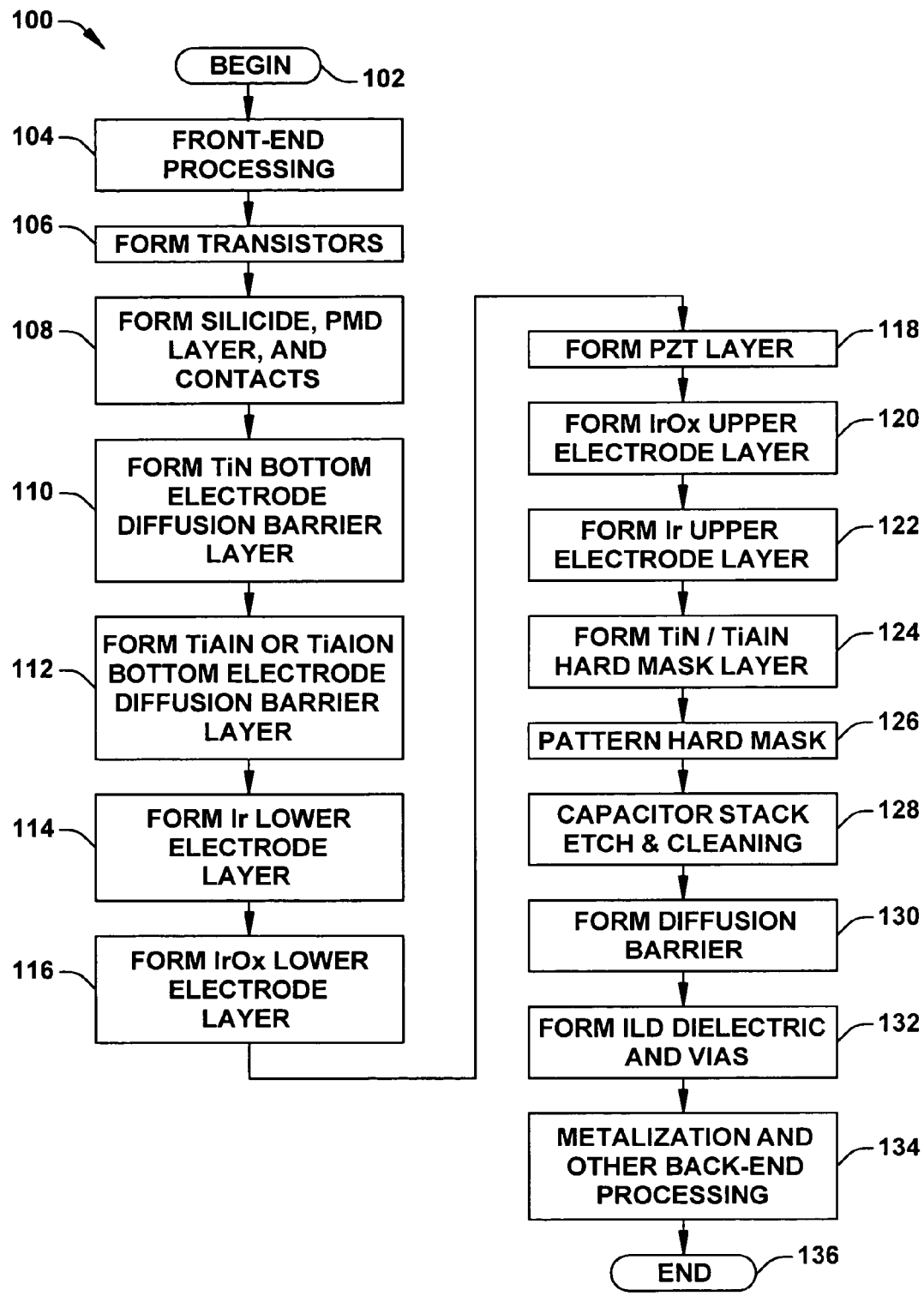
FIG. 2 is a flow diagram illustrating a process for fabricating semiconductor devices with ferroelectric capacitors in which one or more aspects of the present invention may be carried out.
Figure 3:
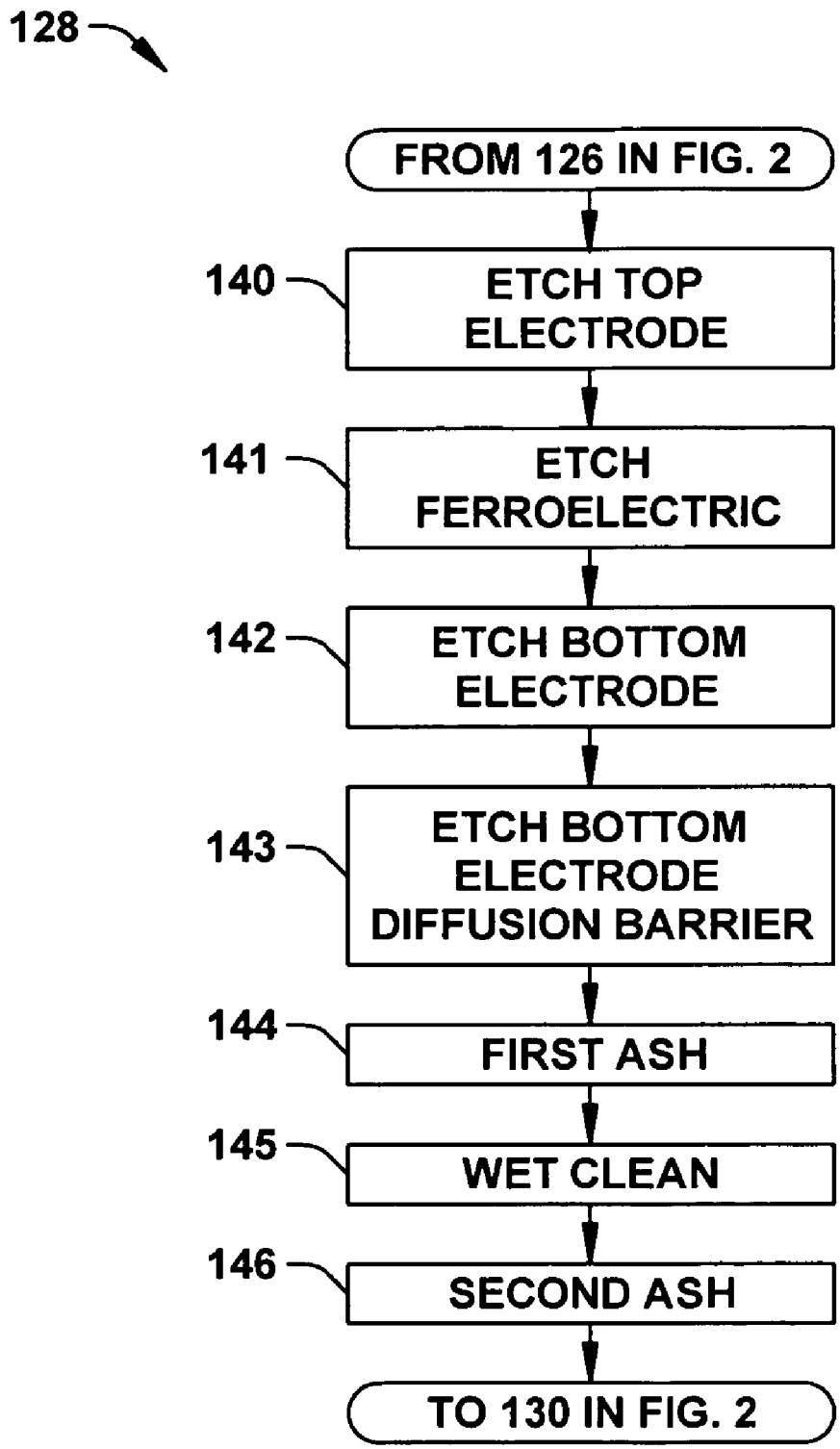
FIG. 3 is a flow diagram illustrating a first exemplary technique for etching and cleaning the ferroelectric capacitor stack in the device of FIGS. 1A and 1B according to the present invention.
Figure 4A:
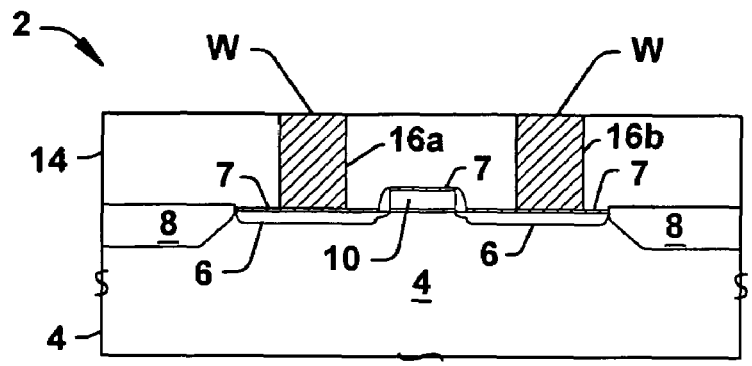
FIGS. 4A-4T are partial side elevation views in section illustrating formation of a ferroelectric memory cell ferroelectric capacitor stack in the device of FIGS. 1A and 1B generally according to the fabrication process of FIG. 2 using the stack etching and cleaning techniques of FIG. 3 in accordance with one or more aspects of the present invention.
Figure 4B:
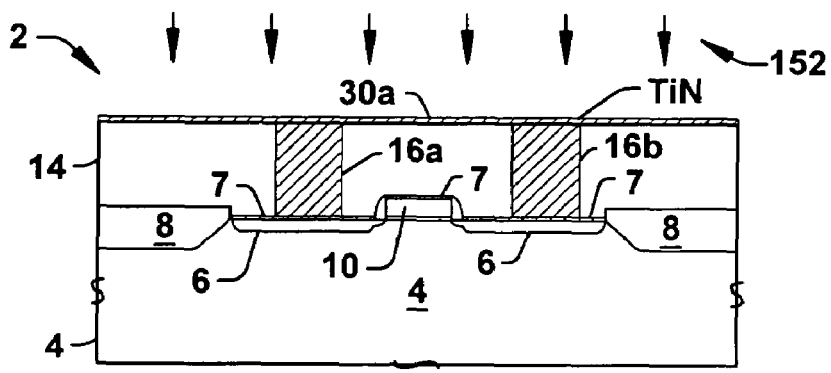
Figure 4C:
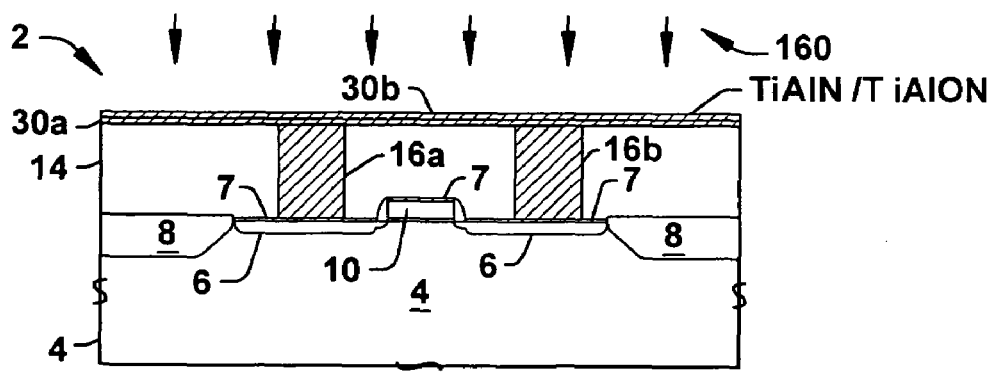
Figure 4D:
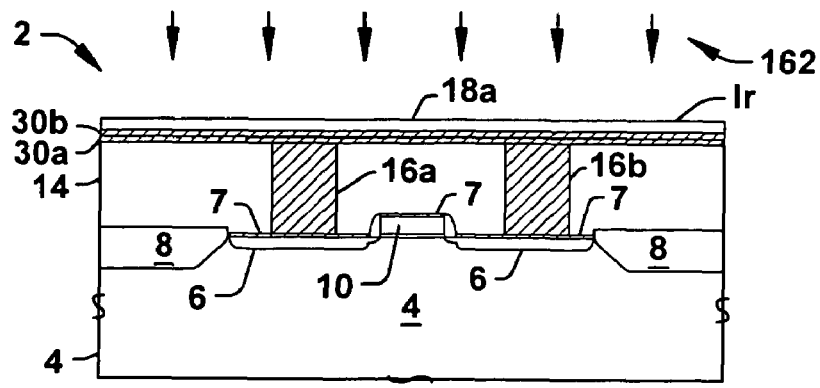
Figure 4E:
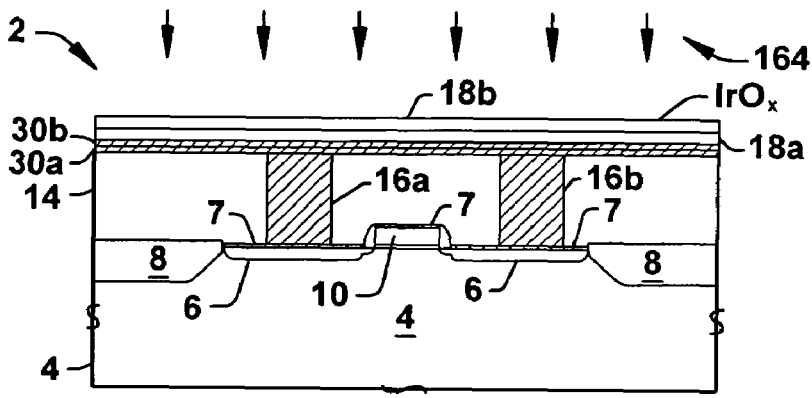
Figure 4F:
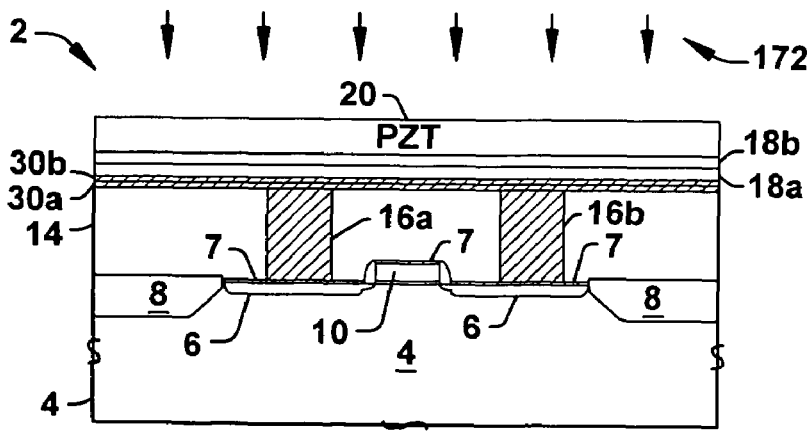
Figure 4G:
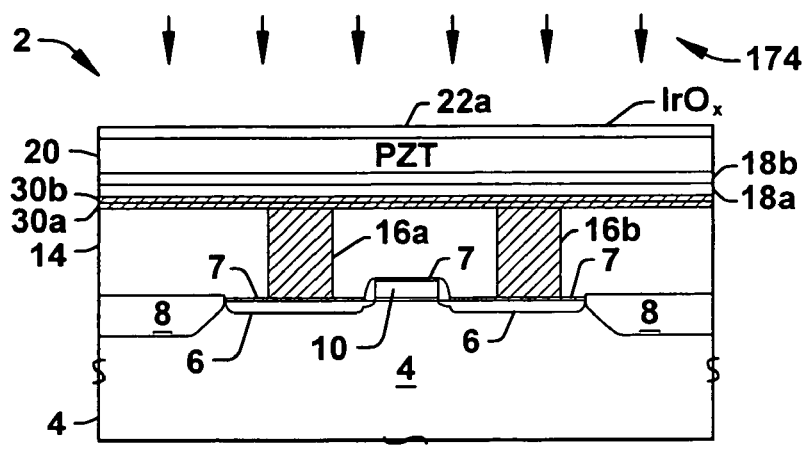
Figure 4H:
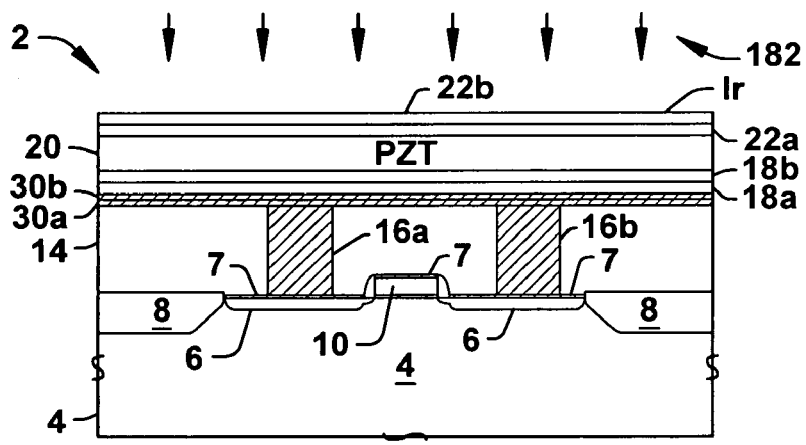
Figure 4I:
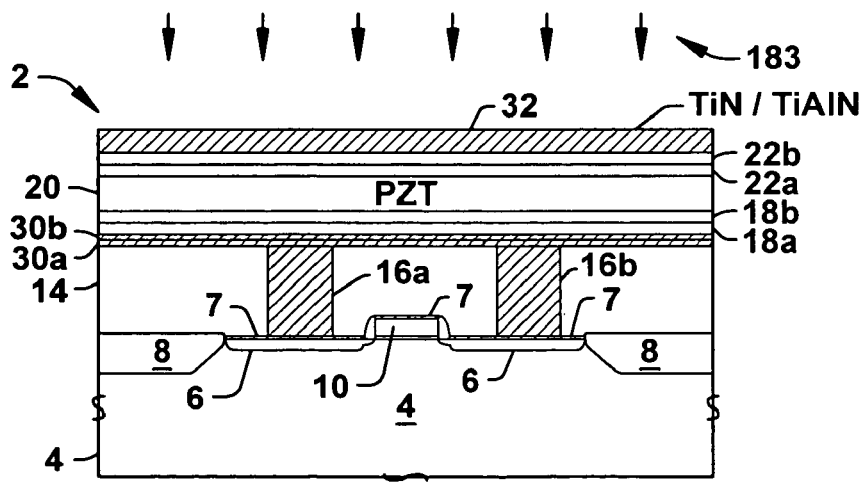
Figure 4J:
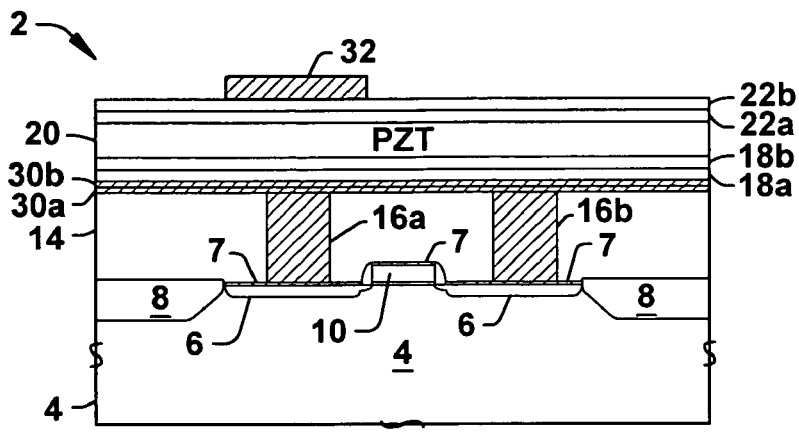
Figure 4K:
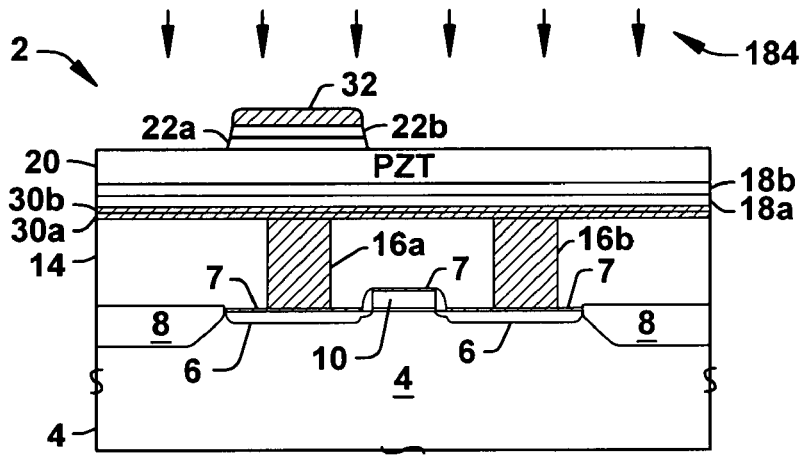
Figure 4L:
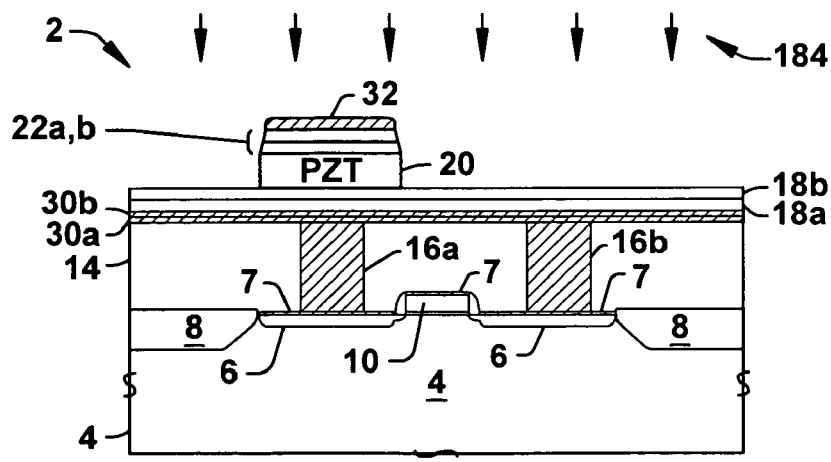
Figure 4M:
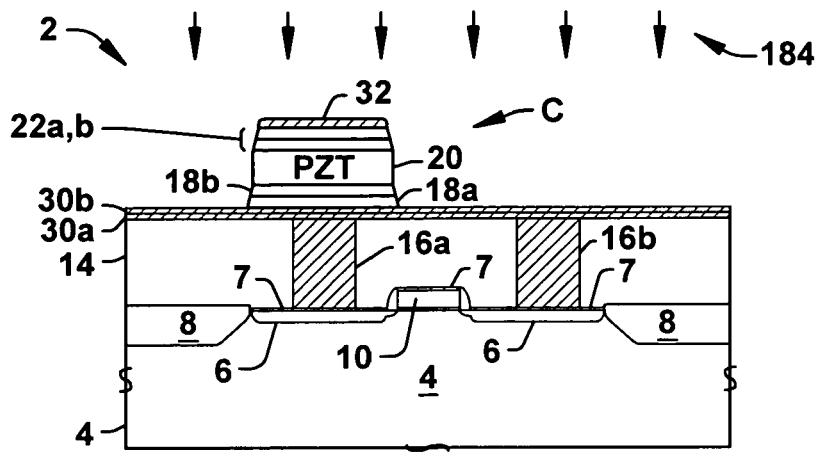
Figure 4N:
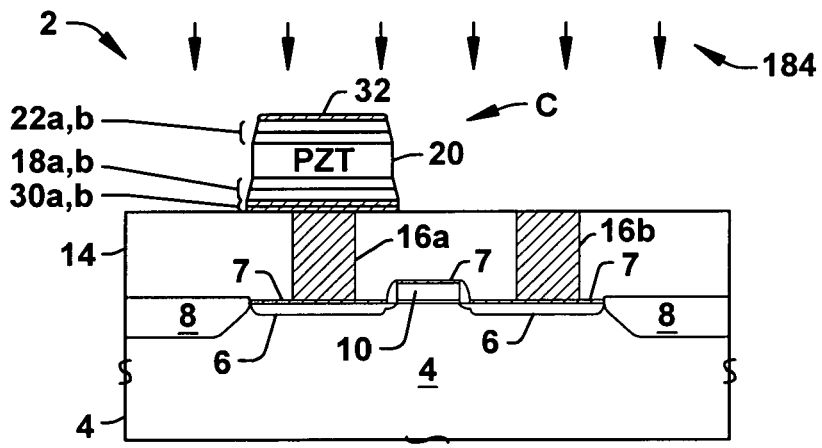
Figure 4O:
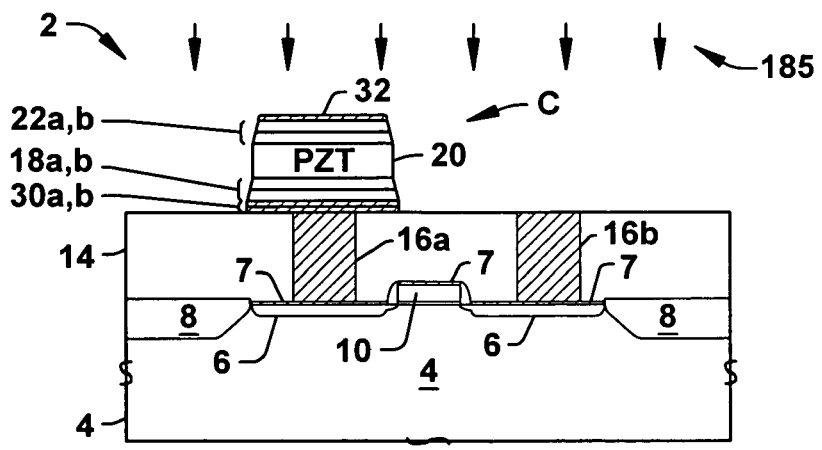
Figure 4P:
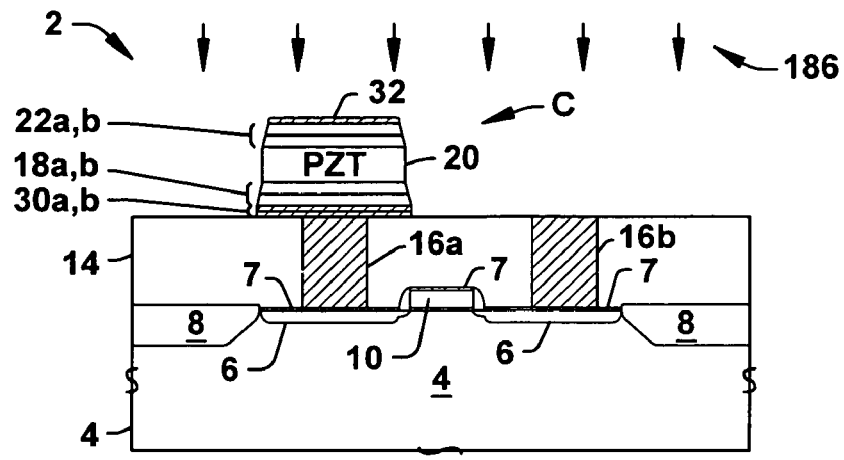
Figure 4Q:
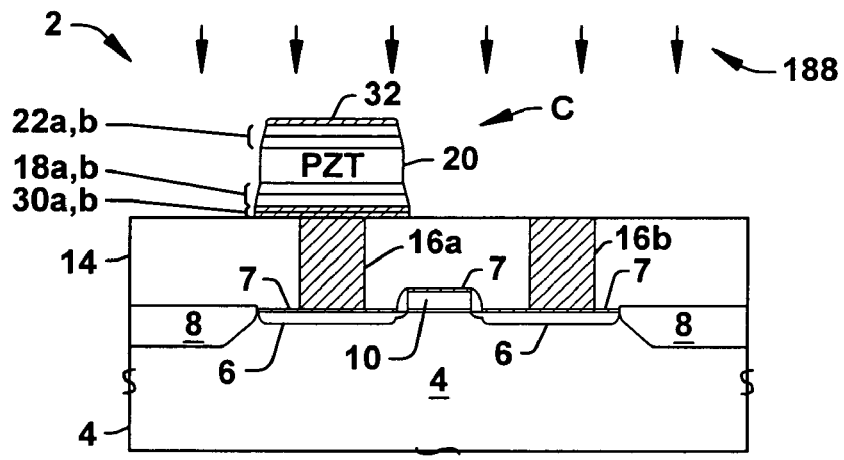
Figure 4R:
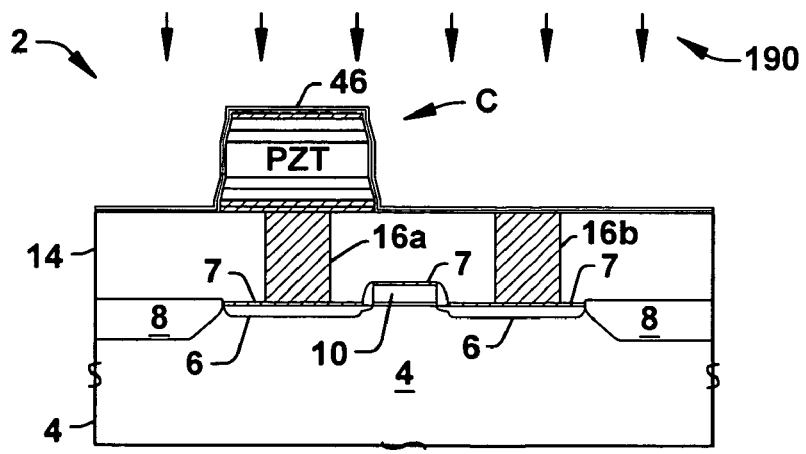
Figure 4S:
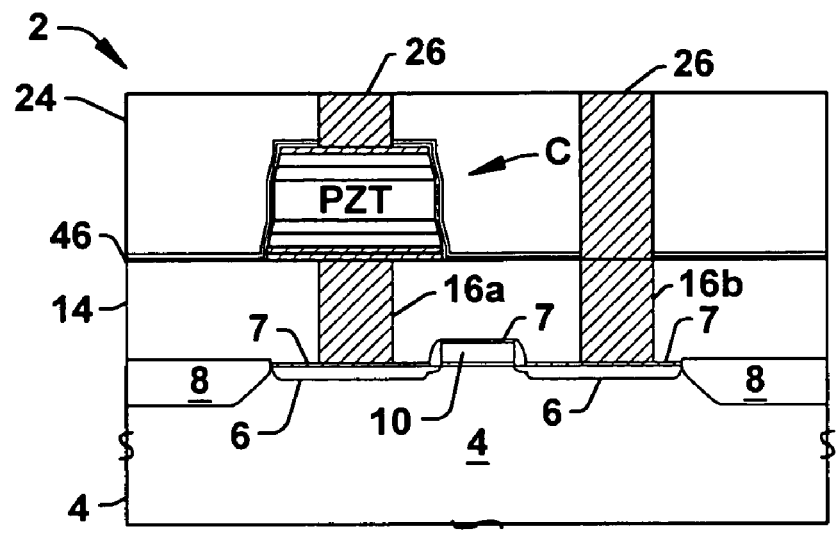
Figure 4T:
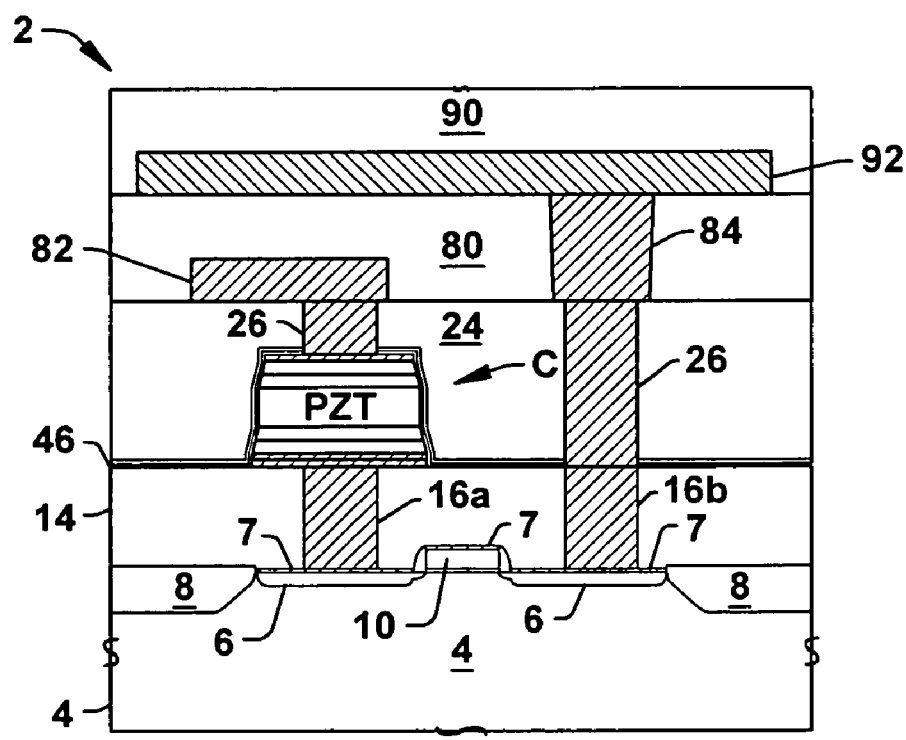
Figure 5:
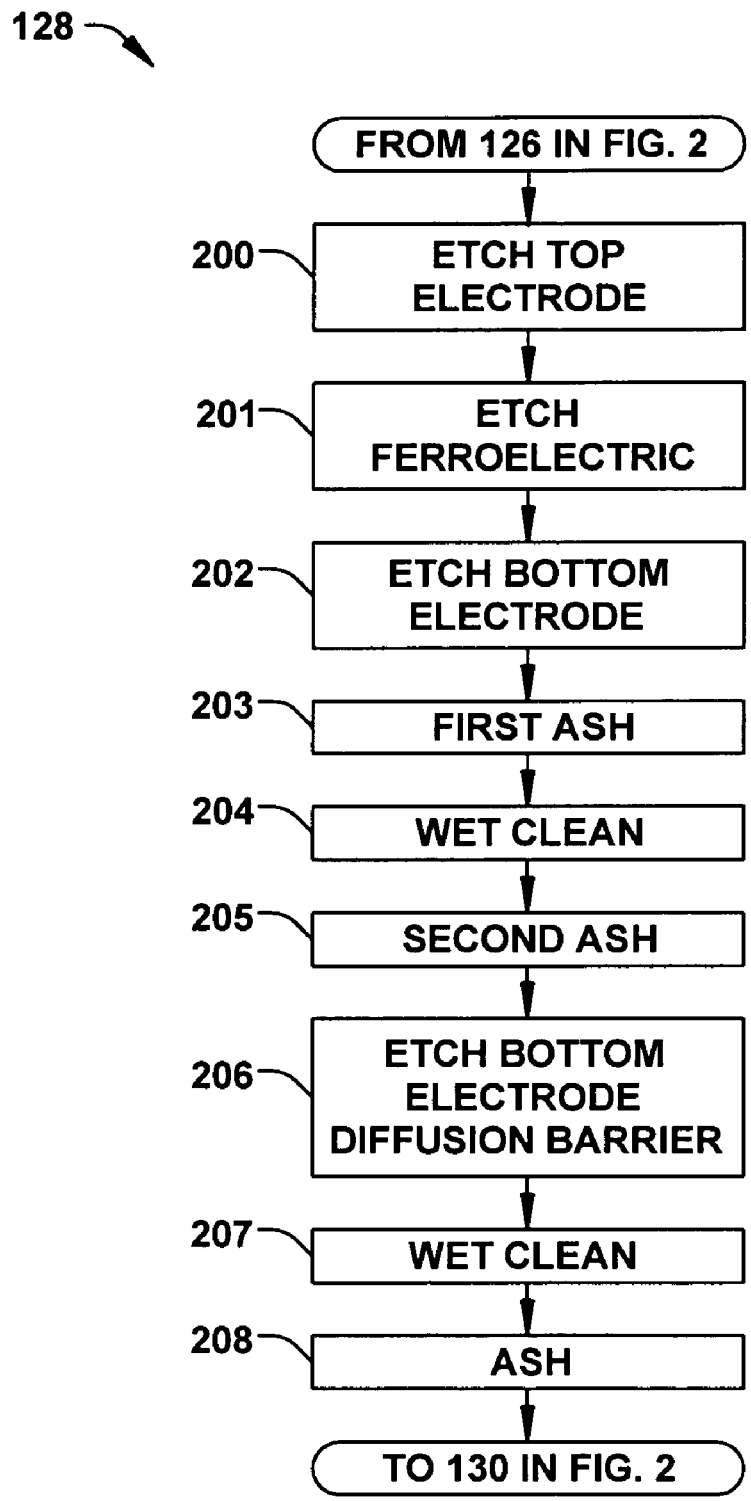
FIG. 5 is a flow diagram illustrating a second exemplary technique for etching and cleaning the ferroelectric capacitor stack that may be employed in the fabrication process of FIG. 2 in accordance with the invention, wherein certain cleaning steps are performed prior to etching the lower electrode diffusion barrier material.
Figure 6A:
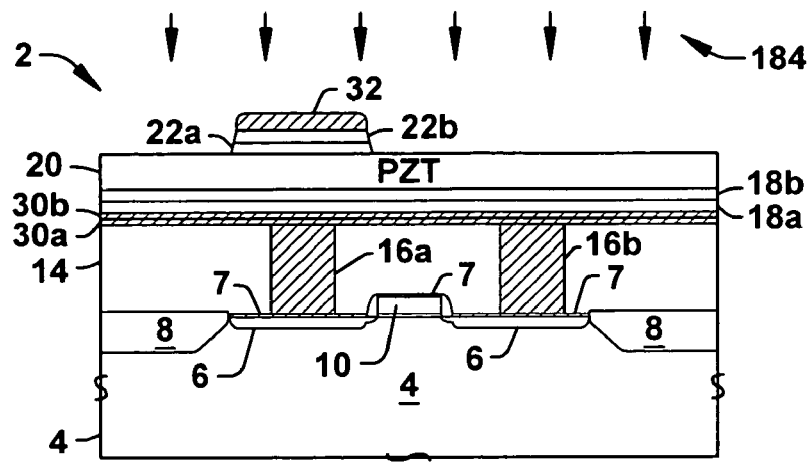
FIGS. 6A-6I are partial side elevation views in section illustrating formation of a ferroelectric memory cell ferroelectric capacitor stack in the device of FIGS. 1A and 1B using the stack etching and cleaning techniques of FIG. 5 in accordance with the invention.
Figure 6B:
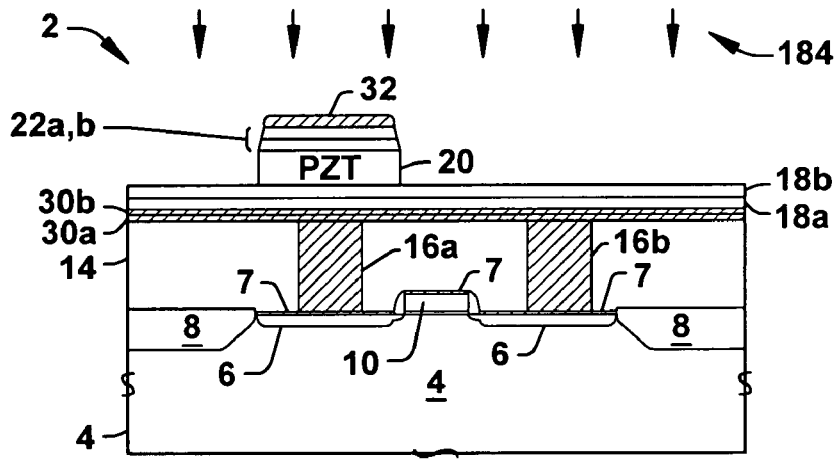
Figure 6C:
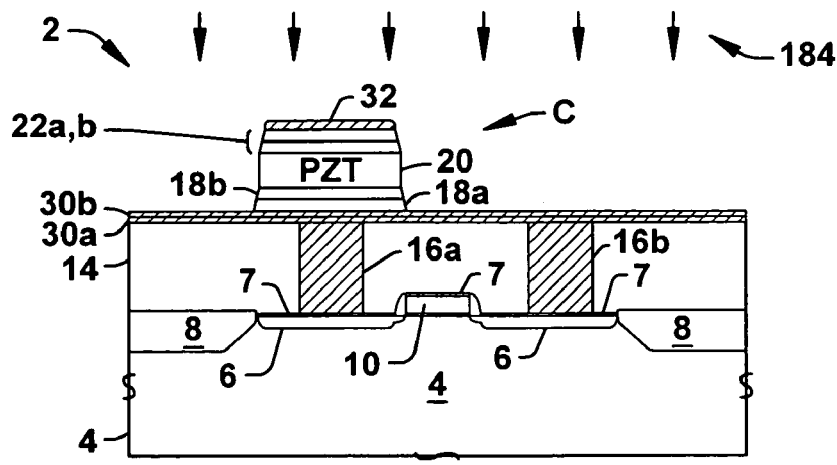
Figure 6D:
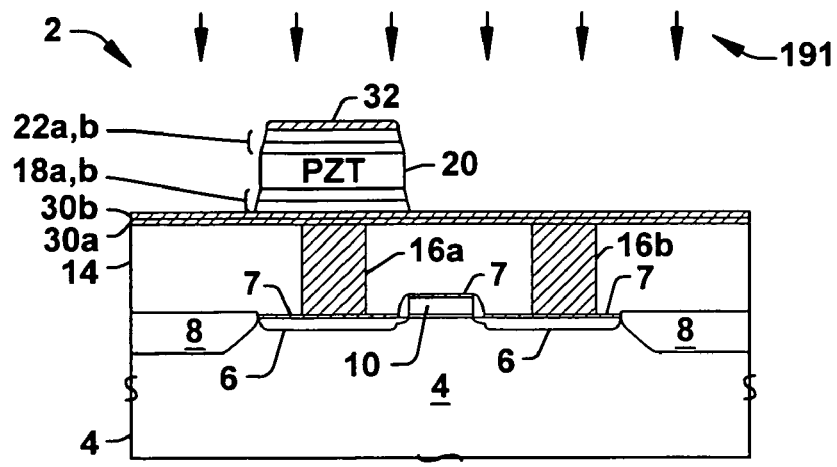
Figure 6E:
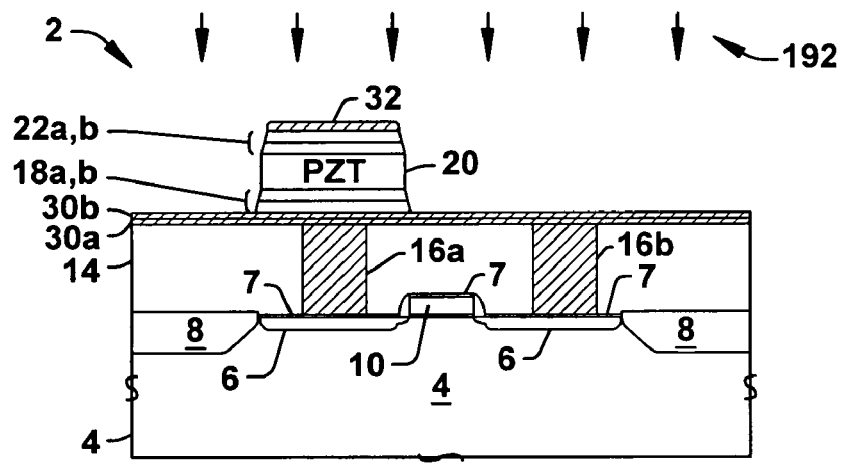
Figure 6F:
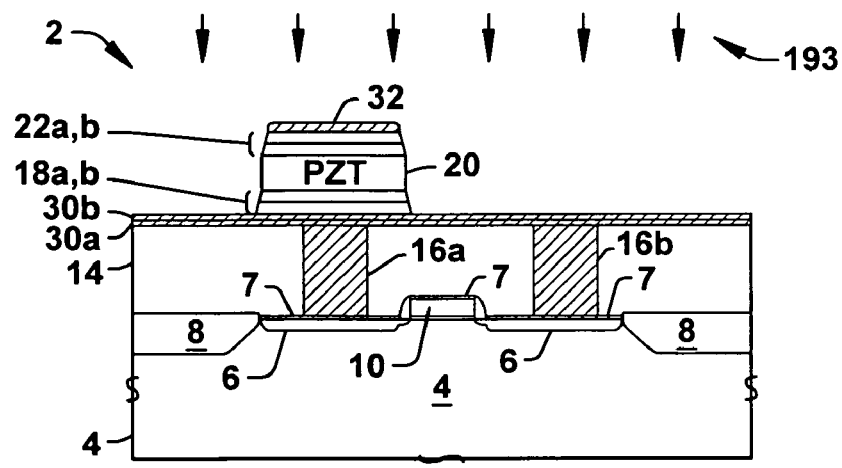
Figure 6G:
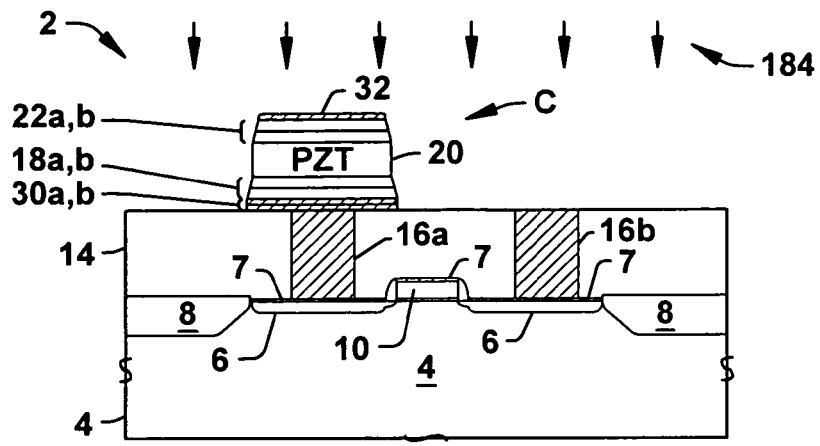
Figure 6H:
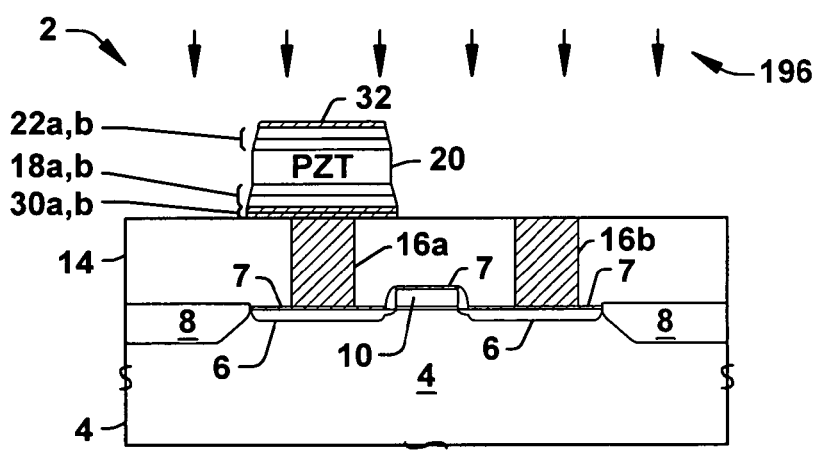
Figure 6I:
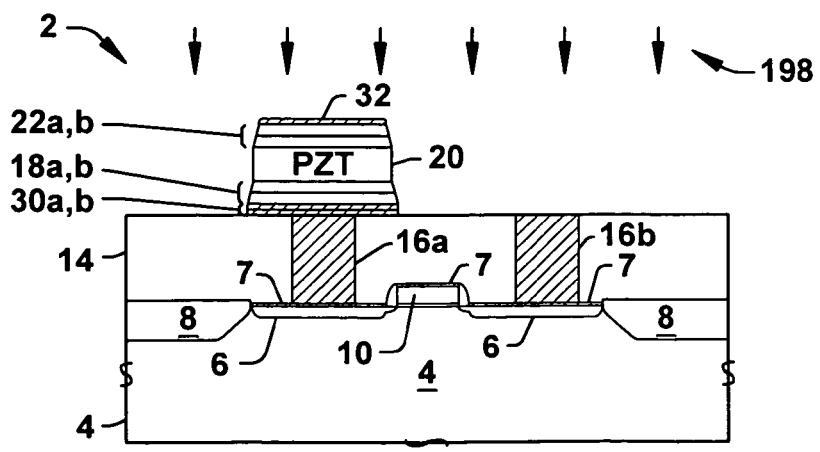

Referring now to FIGS. 2-6I, FIGS. 2, 3, and 5 illustrate two exemplary implementations of an exemplary semiconductor device fabrication process flow or method 100 according to one or more aspects of the present invention, and FIGS. 4A-4T and 6A-6I illustrate the exemplary device 2 undergoing processing at various stages of fabrication. While the method 100 of FIGS. 2, 3, and 5 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

The methods of the present invention, moreover, may be implemented in association with the fabrication of devices illustrated and described herein as well as in association with other devices and structures not illustrated. For example, the exemplary method 100 may be employed in fabricating the exemplary semiconductor device 2 above or other ferroelectric memory devices and ferroelectric capacitors thereof. Also, while the following examples illustrate exemplary ferroelectric capacitors formed using PZT ferroelectric material and Ir/IrO$_x$ electrode materials, the invention may be employed in association with ferroelectric capacitors fabricated with any suitable dielectric and electrode materials, wherein all such variant implementations are contemplated as falling within the scope of the present invention.

In addition, while the exemplary semiconductor devices are illustrated herein with ferroelectric capacitors C formed in a dielectric layer or level (ILD0 24 in FIGS. 1A and 1B) after front-end contact formation and prior to formation of overlying metalization levels, the various aspects of the invention may be employed at other points in a fabrication process, for example, wherein the ferroelectric capacitors are formed at any level in a multi-level semiconductor device design. Furthermore, the invention may be employed in semiconductor devices (e.g., integrated circuits) fabricated on or in any type of semiconductor body, including but not limited to silicon substrates (e.g., such as the semiconductor body 4 in the device 2 of FIGS. 1A, 1B, 4A-4T, and 6A-6I), SOI wafers, epitaxial layers formed above a substrate, etc. In this regard, the invention is not limited to the examples illustrated and described herein, wherein all such alternative implementations are contemplated as falling within the scope of the present invention and the appended claims.

FIG. 2 illustrates the method 100 including capacitor stack etching and cleaning at 128, wherein one exemplary implementation of the processing at 128 is further illustrated in FIG. 3. FIGS. 4A-4T, in turn, illustrate the device 2 being processed according to the implementation of FIGS. 2 and 3, as described further below. In addition, FIG. 5 provides an alternate implementation of the capacitor stack etching and cleaning at 128 of FIG. 2, wherein FIGS. 6A-6I illustrate fabrication of the device 2 according to the exemplary implementation of FIGS. 2 and 5.

In FIG. 2, the method 100 begins at 102, wherein front-end processing is performed at 104, such as creation of n and p-wells in the semiconductor body 4 and isolation structures (e.g., shallow trench isolation (STI) structures 8 in FIG. 4A or field oxide structures formed using local oxidation of silicon (LOCOS) techniques) in field areas of the wafer. At 106, transistors are formed for logic or analog circuitry and for ferroelectric memory cells (e.g., the exemplary memory cell transistor T is formed in the semiconductor body 4 in FIG. 4A). At 108, silicide structures 7 are formed at the transistor terminals (e.g., source/drains and gate), an initial dielectric material is formed over the transistors, referred to herein as a pre-metal dielectric (PMD layer 14 in FIG. 4A), and conductive contacts 16 (e.g., tungsten, polysilicon, or other conductive material) are formed through the PMD layer for connection to the silicide 7 at the cell transistor bitline source/drain 6 as well as the source/drain 6 for connection at a cell storage node with the subsequently formed ferroelectric cell capacitor. In the exemplary device 2, the gate 10 forms a wordline structure, wherein contacts 16 need not be formed directly over the individual transistor gates 10, as illustrated in FIG. 4A. Any suitable dielectric material 14 of any desired thickness can be employed at 108 in forming the initial PMD layer 14. In one possible implementation, a selective etch process (reactive ion etching or other suitable etch process with appropriate etch mask, not shown) is used at 108 to selectively etch portions of the PMD material 14, thereby creating openings into which tungsten or other conductive material 16 is provided to create the conductive contacts 16a and 16b, as illustrated in FIG. 4A.

At 110-122, ferroelectric capacitor layers are formed over the PMD layer 14 and the contacts 16 thereof (FIGS. 4B-4H), including formation of upper and lower conductive capacitor electrode and diffusion barrier layers 30, 18, 22, as well as a ferroelectric material (PZT) layer 20 between the electrode layers 18 and 22. At 124 and 126, a conductive stack etch hardmask is then formed and patterned (FIGS. 4I and 4J). In general, any suitable materials, material thicknesses, and layer formation processes may be employed in forming the ferroelectric capacitor dielectric, electrode, and barrier layers within the scope of the invention, including single or multilayers.

In the illustrated implementation, a bilayer conductive bottom or lower electrode diffusion barrier structure 30 is initially created at 110 and 112 comprising a TiN layer 30a formed at 110 over the PMD dielectric 14 and the PMD tungsten contacts 16 (FIG. 4B) to a thickness of about 4 nm via sputtering, chemical vapor deposition (CVD), or other suitable material deposition process 152, although other materials and processes may be employed, including but not limited to TaSiN, TiSiN, TiN, TaN, HfN, ZrN, HfAlN, CrN, TaAlN, CrAlN, or any other conductive material 30 formed to any suitable thickness. In the exemplary method 100, the deposition process 152 used for formation of the TiN layer 30a is reactive sputter deposition using Ar+N$_2$ or Ar+NH$_3$, although other inert gases can be substituted instead of Ar for the process 152. Other suitable deposition techniques 152 may include chemical vapor deposition (CVD) or plasma enhanced CVD (PECVD). Referring also to FIG. 4C, when tungsten (W) is used for the contacts 16, it is preferred to deposit a bilayer diffusion barrier 30a and 30b, as in the exemplary device 2. At 112 in FIG. 2, a TlAlN or TiAlON layer 30b is deposited over the TiN layer 30a via a deposition process 160, as illustrated in FIG. 4C. The layer 30b may be formed to any suitable thickness at 112, such as about 30 nm in the illustrated implementation. Any suitable deposition process 160 may be employed at 112, including but not limited to physical vapor deposition (PVD), CVD or PECVD deposition, wherein a preferred proportion of aluminum in TiAlN is around 30-60% Al, more preferably about 40-50% in order to have improved oxidation resistance.

The lower electrode layers 18 are then formed at 114 and 116. At 114, a lower electrode metal layer 18a is formed over the barrier 30 via a deposition process 162, as shown in FIG. 4D. In the exemplary device 2, the layer 18a is Ir deposited by a sputter deposition process 162 to a thickness of about 20 nm at a deposition temperature below 450 degrees C., although CVD or PVD processes and other materials and thicknesses could alternatively be employed at 114. Other suitable conductive materials can be used for the layer 18a, including but not limited to IrO$_x$, Pt, Pd, PdO$_x$, IrPt alloys, Au, Ru, RuO$_x$, (Ba,Sr,Pb)RuO$_3$, (Sr,Ba,Pb)IrO$_3$, Rh, RhO$_x$, LaSrCoO$_3$, etc., or any stack or combination thereof. Thereafter at 116, a metal oxide layer 18b is formed, such as a lower IrO$_x$ deposited using a PVD or sputter deposition process 164 to a thickness of about 30 nm in the exemplary device 2, as illustrated in FIG. 4E. In general, the upper and lower electrodes 18 and 22 in the illustrated device 2 are both bi-layers comprising iridium and iridium oxide (Ir and $IrO_x$), with lead zirconate titanate (PZT) ferroelectric material 20 formed between the $IrO_x$ layers 18b and 22a of the electrodes, wherein a first layer of Ir 18a and an overlying $IrO_x$ layer 18b are used with the barrier layers 30a and 30b in the illustrated device 2, although the invention is not limited to any particular materials or thicknesses for these layers.

Referring also to FIG. 4F, a PZT ferroelectric material 20 is then formed over the lower $IrO_x$ layer 18b at 118. The material 20 is deposited at 118 over the lower electrode material 18b using any appropriate deposition process 172, such as metal organic chemical vapor deposition (MOCVD) using any suitable ferroelectric materials, including but not limited to $Pb(Zr,Ti)O_3$ (lead zirconate titanate, PZT), doped PZT with donors (Nb, La, Ta) acceptors (Mn, Co, Fe, Ni, Al) and/or both, or PZT doped and alloyed with $SrTiO_3$, $BaTiO_3$ or $CaTiO_3$, or stacks or combinations thereof, or other (e.g., non-PZT) ferroelectric material formed to any desired thickness (e.g., 300 to 1000 Å, preferably about 700 Å in the illustrated example).

Referring now to FIGS. 2 and 4G, after the deposition of the PZT material 20, the top electrode 22 is formed at 120-122 using any suitable conductive material or materials, such as Ir, $IrO_x$, $RuO_x$, $RhO_x$, $PdO_x$, $PtO_x$, $AgO_x$, (Ba, Sr)$RuO_3$, $LaSrCoO_3$, $LaNiO_3$, $YBa_2Cu_3O_{7-x}$ with a noble metal layer thereover, or stacks or combinations thereof. In the illustrated device 2, the upper electrode 22 is a bi-layer comprising an upper $IrO_x$ layer 22a formed over the PZT 20, and an Ir layer 22b formed over the $IrO_x$ layer 22a, wherein the electrode layers 22 may be formed at 120 and 122 to any desired thickness using any suitable processes in accordance with the invention. In the illustrated example, an upper $IrO_x$ layer 22a is formed at 120 on top of the ferroelectric material 20 via a sputter deposition process or reactive PVD process 174 in Ar+$O_2$ (FIG. 4G) to a thickness of about 100 nm or less (e.g., about 30 nm in one example). In this implementation, it is advantageous for Pb based ferroelectrics 20 to have a conductive oxide top electrode such as $IrO_x$, $RuO_x$, $RhO_x$, $PdO_x$, $PtO_x$, $AgO_x$, (Ba,Sr)$RuO_3$, $LaSrCoO_3$, $LaNiO_3$, $YBa_2 Cu_3O_{7-x}$, rather than a pure noble metal directly over the PZT 20 to minimize degradation due to many opposite state write/read operations (fatigue). Moreover, where the first upper electrode material 22a is an oxide, it is advantageous to have a noble metal layer 22b above it to help maintain low contact resistance between the subsequently formed metal plateline contact 26 and the oxide 22a. Thus, in the exemplary method 100, an upper Ir layer 22b or other suitable metal is deposited at 122, wherein the exemplary upper Ir layer 22b is deposited to a thickness of about 100 nm or less over the upper $IrO_x$ 22a in the device 2 using a deposition process 182, as shown in FIG. 4H. Any suitable deposition process 182, conductive material 22b, and thicknesses can be employed at 122, wherein the exemplary process 182 is a PVD deposition in Ar to form about 20 nm of Ir 22b.

Referring also to FIG. 4I, a hard mask layer 32 is formed (e.g., deposited over the upper Ir layer 22b) at 124 of TiN, TlAlN, or other suitable conductive material via a deposition process 183, where the hard mask 32 may be a single or multi-layer structure of any suitable thickness. As illustrated in FIG. 4J, the hardmask material 132 is then patterned so as to cover portions of the underlying layers 22, 20,18, and 30 in a prospective capacitor region of the device 2, and the expose the remainder of the device 2, so as to operate as a etch hard mask in subsequent capacitor stack structure etching. In this manner, the hard mask material 32 is pattered according to the desired final size (area) and shape of the capacitor C prior to performing the etch process at 128.

At 128, the capacitor stack structure is defined by etching using the patterned hard mask 32, wherein FIG. 3 illustrates one exemplary implementation of the etching and cleaning processing at 128 in accordance with the present invention. In particular, the inventors have found that performing a first ash operation, a wet clean operation, and a second ashing operation in an oxidizing environment (with no intervening deposition steps between the wet clean and the second ash) after the capacitor electrode and dielectric layers have been patterned (e.g., etched), results in reduction in the amount of ferroelectric capacitor leakage, wherein the etching and cleaning implementation of FIGS. 3 and 4K-4Q performs these cleaning steps following the etching of the lower electrode diffusion barrier layers 30, and the implementation of FIGS. 5 and 6A-6I performs these cleaning steps between etching of the lower electrode 18 and the lower electrode diffusion barrier 30.

Referring now to FIGS. 3 and 4K, the capacitor electrode and ferroelectric material layers 22, 18, and 20 may be etched using separate etch processes and separate masks, or these may be etched using a single process and a single mask 32 within the scope of the invention. In the exemplary device 2, a single etch mask 32 is employed at 140-143 in FIG. 3 in conjunction with a reactive ion etching (RIE) process 184, that begins with removal of exposed portions of the upper electrode layers 22a and 22b, as shown in FIG. 4K. At 141, the exposed portion of the ferroelectric material 20 is removed by the process 184 (FIG. 4L). The process 184 continues at 142 to remove exposed portions of the lower electrode layers 18, thereby defining a patterned ferroelectric capacitor structure C, as illustrated in FIG. 4M. In this implementation, the etch process 184 then continues at 143 to remove exposed portions of the lower electrode diffusion barrier layers 30, as shown in FIG. 4N, wherein the etch chemistry and settings of the etch process 184 may be adjusted between layers or separate etch processes may be used. It is noted at this point that any suitable etch process or processes may be employed in patterning the capacitor structure layers, wherein the invention is not limited to reactive ion etching techniques.

Post-etch cleaning is then performed at 144-146 in accordance with the present invention. At 144, the patterned ferroelectric capacitor structure C is ashed using a first ashing process 185 (FIG. 4O), which can be any suitable ashing process within the scope of the invention. In one example, the first ash process 185 employs a plasma to remove residual particles caused by the capacitor stack etch process 184 at a power of about 1400 W and a pressure of about 2000 mT for about 480 seconds with an oxygen (e.g., $O_2$+$N_2$) flow of about 3500/500 sccm and at a chuck temperature of about 250 degrees C., although any suitable ashing process and parameters can be used within the scope of the invention.

At 145, a wet clean process 186 is performed (FIG. 4P) using any suitable fluids to further clean the stack structure C, including but not limited to deionized (DI) water, or phosphoric or sulphuric acid in water at a suitable concentration, therein the exemplary wet clean operation 186 is performed at roughly room temperature or may be done at a slightly elevated temperature. Any suitable wet cleaning process 186 can be performed at 145 within the scope of the invention.

A second ashing operation 188 is then performed (FIG. 4Q) at 146, with no intervening material formation steps between the wet clean process 186 and the second ashing process 188 (e.g., the second ash is performed at 146 directly after the wet clean at 145). In the exemplary method 100, the second ashing process 188 employs a plasma at an RF power of about 1500 W and a pressure of about 1000 mT for about 210 seconds with an oxygen ($O_2$) flow of about 4000 sccm (e.g., oxidizing ambient) and at a chuck temperature of about 300 degrees C. or more, such as 300-350 degrees C. in one example, although the invention is not limited to these specific settings. An exemplary ash tool that may be used is the Fusion 200MC, although other tools may be employed and are contemplated by the present invention. The second ashing process 188 may be performed using any suitable ashing tools or equipment, and may involve remote RF plasma (e.g., 13.5 MHz) and/or electron-cyclotron resonance (ECR) plasma ashing (e.g., 2 GHz) to facilitate provision of high current, low energy plasma in the ashing operation 188. It is noted that a portion of the hard mask 32 may remain after completion of the etch process 184 as shown in FIG. 4N, or the hard mask 32 may be removed entirely by the etch 184 or by the subsequent cleaning operations 185,186, and/or 188. The inventors have found that performing the second ashing process at 146 operates to reduce ferroelectric capacitor leakage, and may also beneficially provide repair of the ferroelectric material, such as through oxidation.

In another exemplary aspect of the present invention, the ash process may be further modified by using a substrate bias and lower pressures in order to have a more physical bombardment of $O_2$. The greater physical bombardment may potentially by useful in oxidizing and/or removing residue on the sides of the ferroelectric capacitor. Exemplary process conditions in such a case may include 1500 W remote plasma power, 200 W substrate plasma power, 500 mTorr pressure, with a duration of about 120 seconds in an $O_2/N_2$ flow of about 1000/200 sccm at temperatures of about 250-350 C.

Returning to FIG. 2 and also referring to FIG. 4R, an optional single or multilayer hydrogen diffusion barrier 46 may then be formed at 130 (FIG. 2) above the patterned ferroelectric capacitor C via suitable deposition process or processes 190 (FIG. 4R) to prevent or inhibit hydrogen diffusion into the ferroelectric material 20 in subsequent (e.g., back-end) processing of the device 2. In one example, the barrier 46 has a thickness of about 30 nm or less, and comprises a first layer of $AlO_x$, $Ta_2O_5$, AlN, $TiO_2$, $ZrO_2$, $HfO_2$, or any stack or combination thereof, as well as a second barrier layer comprising SiN, AlN, or stacks or combinations thereof with a thickness of about 30 nm or less (e.g., $AlO_x$ and SiN layers 46 in the device 2 of FIG. 1B above), where the barrier layers 46 can be formed by any suitable processing or may alternatively be omitted in accordance with the invention. In the illustrated example, moreover, the $AlO_x$ layer operates as a lead (Pb) and hydrogen (H) diffusion barrier while the silicon nitride (e.g., $Si_3N_4$) layer is subsequently used as a contact etch stop. In this example, the $AlO_x$ is deposited at 130 over the patterned ferroelectric capacitor stack C using atomic layer deposition (ALD) 190, wherein other deposition techniques and materials may alternatively be used that do not react with the PZT material 20 of the patterned capacitor structure C. The second hydrogen barrier layer is then formed at 130 by deposition of silicon nitride ($Si_3N_4$) over the $AlO_x$ layer using a PECVD or other suitable deposition process 190.

Following formation of the upper diffusion barrier 46 at 130, an inter-level dielectric (e.g., ILD0) is deposited at 132 (layer 24 in FIG. 4S), which is then selectively etched to form via/contact openings for electrical coupling to the upper ferroelectric capacitor electrode 22 and to the previously formed bitline contact 16b in the underlying initial PMD layer 14. The openings are then filled with conductive material (e.g., copper, aluminum, tungsten, or other conductive material) to form the bitline and capacitor plateline contacts or vias 26 in the ILD0 layer (e.g., ILD0 vias (V0) in the capacitor level), as shown in FIG. 4S. The ILD material 24 may be silicon dioxide ($SiO_2$), FSG, or other suitable dielectric. Thereafter, further metalization levels can be formed at 134, as shown in FIG. 4T, including another ILD material 80 (e.g., ILD1 level) with a conductive plateline routing structure 82 and an ILD1 bitline via 84, as well as an overlying ILD2 dielectric 90 in which a conductive (e.g., copper) bitline routing structure 92 is formed, after which other back-end processing is performed (not shown) to complete the device 2, and the exemplary fabrication method 100 ends at 136.

Another possible implementation of the invention is presented in FIGS. 5 and 6A-6I, wherein FIG. 5 illustrates an alternate implementation of the capacitor stack etching and cleaning at 128 of FIG. 2, and FIGS. 6A-6I illustrate fabrication of the device 2 according to the implementation of FIGS. 2 and 5. After the hard mask is patterned at 126 in FIG. 2, the capacitor stack etching and cleaning at 128 begins at 200 in FIG. 5, where an etch process 184 is begun (FIG. 6A) to initially remove exposed portions of the upper electrode layers 22a and 22b. At 201, the exposed portion of the ferroelectric material 20 is removed by the process 184 (FIG. 6B), and at 202, the etch 184 continues (FIG. 6C) to remove exposed portions of the lower electrode layers 18, thereby defining the patterned ferroelectric capacitor structure C.

In this implementation, post-etch cleaning is then performed at 203-205 before the exposed portions of the lower electrode diffusion barrier structure 30 is removed in accordance with the present invention. At 203, a first ashing process 191 is performed (FIG. 4O), which can be any suitable ashing process within the scope of the invention (e.g., such as the exemplary first ash process 185 in FIG. 4O above). At 204, a wet clean process 192 is performed in FIG. 4P using any suitable fluids (e.g., deionized (DI) water, phosphoric acid, sulphuric acid, etc.). At 205, a second ashing operation 193 is then performed in FIG. 6F, with no intervening material formation steps between the processes 192 and 193. In the implementation of FIGS. 5 and 6A-6I, the exemplary second ashing process 193 employs a plasma at an RF power of about 1500 W and a pressure of about 1000 mTorr for about 210 seconds, with an oxygen ($O_2$) flow of about 4000 sccm (e.g., oxidizing ambient) at a chuck temperature of about 300 degrees C. or more (e.g., about 300-400), however, the present invention is not limited to the above process conditions. Further, an exemplary ash tool that may be used is the Fusion 200MC. In the above example, the ash process may be made even more aggressive than in the preceding examples since the tungsten (W) contacts are not exposed. The ash may be made more aggressive by either increasing the temperature, increasing the ash time, or making it more physical by manipulating the substrate bias and/or decreasing the pressure.

In the above examples, the term "ash" is used to describe processes that are highly oxidizing. The ash process of the present invention may, however, include other chemistries with or instead of $O_2$. For example, the ash process may include chemistries such as $N_2O$, ozone, $NO_2$, or $H_2O$ instead of, or in addition to $O_2$, and also may include other components such as $N_2$, noble gasses such as Ar, Ne or He, plus more reactive compounds such as fluorocarbons (e.g., $CF_4$). The process tool used in the present invention may include an asher, but alternatively may be an etch tool. In particular, the alternating oxidizing gasses have potential advantages over $O_2$ as the primary oxidizing gasses since they are potentially more reactive. For example, these gases may create more O radicals that just $O_2$ after plasma formation. In fact, if the desired process includes a significant substrate bias and operates at lower pressure, than a typical ash type tool may not have sufficient capability and in such instances a more conventional etch tool may be utilized.

In this implementation, moreover, the etch process 184 (FIG. 2G) is then resumed (e.g., or another etch process is started) at 206 to remove exposed portions of the lower electrode diffusion barrier layers 30. Thereafter, further cleaning can be performed. For example, in FIG. 6H a second wet clean operation 196 can be performed at 207, and a third ashing process 198 (FIG. 6I) may then be performed at 208 prior to formation of the upper diffusion barrier at 130 in FIG. 2 above, wherein the third ashing operation 198 may be performed at a somewhat lower temperature and/or for a shorter time (e.g., below about 300 degrees C. for about 1 minute or less in one example). In this regard, the clean steps at 207 and 208 are optional, and may be any suitable wet clean and ashing processes 196 and 198, respectively, within the scope of the invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a ferroelectric capacitor structure in a semiconductor device, the method comprising:
    forming a lower electrode diffusion barrier structure over a dielectric material, the lower electrode at least partially engaging a conductive structure in the dielectric material;
    forming a lower electrode over the lower electrode diffusion barrier structure;
    forming a ferroelectric material over the lower electrode;
    forming an upper electrode over the ferroelectric material;
    forming a patterned etch mask over the upper electrode, the patterned etch mask exposing a portion of the upper electrode;
    etching portions of the upper electrode, the ferroelectric material, and the lower electrode to define a patterned ferroelectric capacitor structure using the patterned etch mask;
    etching a portion of the lower electrode diffusion barrier structure using the patterned etch mask;
    ashing the patterned ferroelectric capacitor structure using a first ashing process;
    performing a wet clean process after the first ashing process; and
    ashing the patterned ferroelectric capacitor structure using a second ashing process directly after the wet clean process at a temperature of about 300 degrees C. or more in an oxidizing ambient;
    wherein the second ashing process is performed using a gas ambient with a primary gas comprising O2 gas;
    wherein the second ashing process is performed at a temperature of about 300 degrees C. or more and about 350 degrees C. or less for about 2 minutes or more and about 3 minutes or less; and
    wherein the first ashing process, the wet clean process, and the second ashing process are performed after etching portions of the upper electrode, the ferroelectric material, and the lower electrode and before etching the portion of the lower electrode diffusion barrier structure.

2. The method of claim 1, wherein the wet clean process comprises one of deionized water, phosphoric acid, and sulphuric acid.

3. A method of fabricating a ferroelectric capacitor structure in a semiconductor device, the method comprising:
    forming a lower electrode diffusion barrier structure over a dielectric material, the lower electrode at least partially engaging a conductive structure in the dielectric material;
    forming a lower electrode over the lower electrode diffusion barrier structure;
    forming a ferroelectric material over the lower electrode;
    forming an upper electrode over the ferroelectric material;
    forming a patterned etch mask over the upper electrode, the patterned etch mask exposing a portion of the upper electrode;
    etching portions of the upper electrode, the ferroelectric material, and the lower electrode to define a patterned ferroelectric capacitor structure using the patterned etch mask;
    etching a portion of the lower electrode diffusion barrier structure using the patterned etch mask;
    ashing the patterned ferroelectric capacitor structure using a first ashing process;
    performing a wet clean process after the first ashing process; and
    ashing the patterned ferroelectric capacitor structure using a second ashing process directly after the wet clean process at a temperature of about 300 degrees C. or more in an oxidizing ambient,
    wherein the first ashing process, the wet clean process, and the second ashing process are performed after etching portions of the upper electrode, the ferroelectric material, and the lower electrode and before etching the portion of the lower electrode diffusion barrier structure.

4. The method of claim 3, wherein the first ashing process, the wet clean process, and the second ashing process are performed after etching the portion of the lower electrode diffusion barrier structure and before an upper diffusion barrier or dielectric material is formed over the patterned ferroelectric capacitor structure.

5. The method of claim 3, wherein the wet clean process comprises one of deionized water, phosphoric acid, and sulphuric acid.

6. The method of claim 3, further comprising:
performing a second wet clean process after etching the portion of the lower electrode diffusion barrier structure; and
ashing the patterned ferroelectric capacitor structure using a third ashing process after the second wet clean process.

7. The method of claim 3, further comprising forming an upper diffusion barrier or dielectric material over the patterned ferroelectric capacitor structure after the second ashing process.

8. A method of etching and cleaning a ferroelectric capacitor structure in a semiconductor device, the method comprising:
etching portions of an upper electrode, a ferroelectric material, and a lower electrode to define a patterned ferroelectric capacitor structure;
etching a portion of a lower electrode diffusion barrier structure;
ashing the patterned ferroelectric capacitor structure using a first ashing process;
performing a wet clean process after the first ashing process; and
ashing the patterned ferroelectric capacitor structure using a second ashing process after the wet clean process at a temperature of about 300 degrees C. or more in an oxidizing ambient, with no material formation processing between the wet clean process and the second ashing process,
wherein the first ashing process, the wet clean process, and the second ashing process are performed after etching portions of the upper electrode, the ferroelectric material, and the lower electrode and before etching the portion of the lower electrode diffusion barrier structure.

9. The method of claim 8, further comprising:
performing a second wet clean process after etching the portion of the lower electrode diffusion barrier structure; and
ashing the patterned ferroelectric capacitor structure using a third ashing process after the second wet clean process.

10. The method of claim 8, wherein the wet clean process comprises one of deionized water, phosphoric acid, and sulphuric acid.

11. The method of claim 8, wherein the second ashing process is performed using a gas ambient with a primary gas comprising O2 gas.

12. The method of claim 11, wherein the second ashing process is performed at a temperature of about 300 degrees C. or more and about 350 degrees C. or less for about 2 minutes or more and about 3 minutes or less.

13. The method of claim 12, wherein the first ashing process, the wet clean process, and the second ashing process are performed after etching the portion of the lower electrode diffusion barrier structure and before an upper diffusion barrier or dielectric material is formed over the patterned ferroelectric capacitor structure.

14. The method of claim 13, wherein the first ashing process is performed at a temperature of about 325 C. or more and about 400 C. or less.

15. The method of claim 13, wherein the first ashing process is performed using a substrate bias of greater than about 50 W.

16. The method of claim 13, wherein the wet clean process comprises one of deionized water, phosphoric acid, and sulphuric acid.

17. The method of claim 8, wherein the first ash process is performed using a gas ambient with a primary gas being $N_2O$, $NO_2$, ozone, or $H_2O$ gas.

18. The method of claim 8, wherein the first ash process comprises a substrate bias greater than about 50 W.

19. The method of claim 8, wherein the second ash process comprises a substrate bias greater than about 50 W.

20. The method of claim 8, wherein the second ashing process is performed at a temperature of about 300 degrees C. or more and about 350 degrees C. or less for about 2 minutes or more and about 3 minutes or less.

* * * * *